United States Patent [19]
Li

[11] Patent Number: 5,161,728
[45] Date of Patent: Nov. 10, 1992

[54] CERAMIC-METAL BONDING

[76] Inventor: Chou H. Li, 379 Elm Dr., Roslyn, N.Y. 11576

[21] Appl. No.: 499,707

[22] Filed: Mar. 27, 1990

Related U.S. Application Data

[63] Continuation-in-part of Ser. No. 277,672, Dec. 14, 1988, abandoned, which is a continuation of Ser. No. 277,666, Nov. 29, 1988, Pat. No. 4,890,783.

[51] Int. Cl.$^5$ .............. B23K 1/19; B23K 1/20; B23K 31/02; B23K 103/16
[52] U.S. Cl. .................................. 228/124; 228/248
[58] Field of Search ............ 228/120, 121, 124, 122, 228/265, 263.12, 248

[56] References Cited

U.S. PATENT DOCUMENTS

| | | | |
|---|---|---|---|
| 3,740,822 | 6/1973 | Singleton | 228/122 |
| 4,075,364 | 2/1978 | Panzera | 228/122 |
| 4,109,031 | 8/1978 | Marscher | 228/122 |
| 4,111,572 | 9/1978 | Noone et al. | 228/124 |
| 4,338,380 | 7/1982 | Erickson et al. | 228/124 |
| 4,348,131 | 9/1982 | Shimanuki et al. | 228/226 |
| 4,529,836 | 7/1985 | Powers et al. | 228/122 |
| 4,593,851 | 6/1986 | Skog | 228/248 |
| 4,703,884 | 11/1987 | Landingham et al. | 228/122 |
| 4,735,866 | 4/1988 | Moorhead | 228/122 |
| 4,890,783 | 2/1990 | Li | 228/263.12 |
| 4,924,033 | 5/1990 | Iyogi et al. | 228/248 |
| 5,000,986 | 3/1991 | Li | 228/124 |

FOREIGN PATENT DOCUMENTS 231472  4/1991  Japan .................. 228/122

Primary Examiner—Samuel M. Heinrich

[57] ABSTRACT

A method for reproducibly making a structural joint between a metal and a ceramic for practical uses above 600° C. comprises uniformly metallizing the ceramic and increasing the ratio of the ceramic material strength to the dynamic and static mismatch stresses due to differential thermal expansions so that these mismatch stresses do not exceed the ceramic material strength at any point and time thereby preventing bond failures.

21 Claims, 2 Drawing Sheets

CERAMIC-METAL BONDING

REFERENCE TO RELATED APPLICATION

This is a continuation-in-part of my pending U.S. application Ser. No. 07/277,672, filed Dec. 14, 1988, now abandoned which is continuation of Ser. No. 07/277,666, filed Nov. 29, 1988, now U.S. Pat. No. 4,890,783. I hereby incorporate by reference both of the above-cited references.

BACKGROUND OF THE INVENTION

1. Field

This invention relates to ceramic-metal bonding, and more particularly relates to ceramic-metal bonding to produce reproducibly strong and thermomechanically shock-resistant and substantially defect-free joints particularly for high-temperature (over 600° C.) uses.

By ceramic I mean not only the usual ceramics such as alumina, zirconia, beryllia, mullite, cordierite, silicon carbide; but also quartz, intermetallics, diamond, boron, graphite, carbon, silicon, and various other carbides, nitrides, aluminides, or borides; glasses, machinable glasses, Corning's Vision glass; and the surface of many metals, particularly reactive metals such as aluminum, magnesium, chromium, silicon, titanium, or zirconium which always have oxides or other compounds of reactions of the metal with the environment.

2. Prior Art

Various methods have been developed to join metal to ceramics But none is very stable, strong, and temperature resistant. Reliable metal-ceramic joints are not commercially available worldwide at any cost.

Under a well-coordinated intensive effort on ceramic-metal bonding, Japan is the most successful country in the development and commercialization of products involving metal-ceramic joints. They already have successfully: 1) used a ceramic turbocharger (NGK, Nissan), 2) produced an all ceramic swirl chamber for diesel engines (Mazda, NGK), and 3) prototyped a ceramic turbomolecular pump (Mitsubuishi, Japan Atomic Energy Research Institute), according to Prof. T. Suga of the University of Tokyo in his 1989 review paper on the "Future Outlook in Japan" (copy enclosed). But they do not fully understand the mechanism of ceramic-metal bonding.

The practical useful temperature of the best Japanese ceramic joints to special "matching" alloys is only 600° C. The bond strength decreases rapidly with temperature, because the reaction products in their bonded regions become weak and brittle under thermal stresses. They consider the improvement of the thermomechanical shock resistance of the joints to be an urgent task. The European effort, mainly in Germany and France, has been even less successful. Germany failed to reach their goal after the first ten-year (1974-1983) program and its follow-up in 1983-1986. Their present program (1985-1994) merely emphasizes on achieving reproducible mechanical properties and component reliability. The US Department of Energy supports much of US ceramic joining R&D. It also had to renew the ceramic automotive program after 10-year, 50-million intensive work.

Many problems still exist with present ceramic metallizing and bonding methods. A serious problem is the difficulty of achieving uniform metallized layers formed on the ceramic Take, for example, the commonly used heavy metal processes, such as W-yttria ($W-Y_2O_3$), W-Fe, or Mo-Mn. In these and many similar joining methods, segregation of the mixed metal or other powders takes place due to their differing specific gravities, shapes, sizes, porosities, and surface smoothness. These segregations occur at all times: during the mixing of the powders, storing of the powder suspensions, application of the suspensions, settling of the suspended powder in the applied coatings of the suspension, and drying of the applied coatings. Further, these segregations occur so fast as to be practically uncontrollable, as will be shown shortly.

In general, spherical, heavy, large, smooth, and dense particles settle first and early in the binder or suspension medium. Upon settling, these particles tend to roll or move sidewise or downward toward the corners or boundaries faster and further than odd-shaped, light, small, rough, and porous particles of otherwise identical characteristics.

Take the $W-Y_2O_3$ mixed powders in an organic binder of nitrocellulose in butyl carbitol acetate with specific gravities of 19.3, 4.5, and 0.98, respectively. Such a suspension, even if perfectly mixed up by shaking, stirring, roller-milling, or otherwise, will immediately tend to segregate. More specifically, the initial settling acceleration due to gravitational minus buoyancy forces on W powders is $980.6\times(19.3-.98)/19.3=930.8$ cmxcm/sec, while that of $Y_2O_3$ powders is only 767.0 cmxcm/sec.

In a mixing, storing, or carrying bottle 10 cm high and containing a perfectly mixed suspension of these metallizing powders, the time to completely settle out is only 147 ms (milliseconds) for W powders, if uniform acceleration is assumed. At the tip of a paint brush having a suspension drop 0.3 cm in diameter, the complete settling time of these same W powders is merely 25.4 ms, while on a horizontally painted or sprayed layer 0.1 cm thick, the same settling time is only 14.7 ms. In all these cases, the complete settling time for the $Y_2O_3$ powders is always the square root of $930.8/767.0=1.21$, or 21% longer.

Note in particular that the powder segregations with uniform accelerations may be completed within 147 to 14.7 ms. Such short times indicate that the $W-Y_2O_3$ powder segregations are beyond human controls. Painted or sprayed mixed powder layers are thus always not uniform.

In metallizing onto a horizontal ceramic surface to be metallized, most of the W powders immediately settles out. The first layers are therefore always very rich in W, and correspondingly very poor in $Y_2O_3$. These first layers are too refractory for the preset metallizing temperature (up to about 1,550° C.) so that the ceramic surfaces are not sufficiently metallized, or not at all. The last settling layers, on the other hand, are too rich in the fluxing $Y_2O_3$. Again, the ceramic surfaces are improperly metallized, with only a glassy layer being formed which is very weak in strength and thermal or thermal shock resistance.

Thus, common metallizing results on ceramics are often erratic and uncontrollable. The metallized surface may contain loose and unmetallized spots with high heavy refractory metal content, as well as non-wettable spots due to the high flux content. The entire process is critical and involved, and yet nonuniform. The resultant ceramic-metal joints or ceramic coatings on metals are weak, costly, nonreproducible, and usually not vacuum-tight, or temperature-resistant.

Painting or spraying onto vertical or inclined surfaces result in vertical and additional lateral segregations and gradations, and gives added poor uniformity, reproducibility, and bonding strength.

While only the effect of gravitational density segregation has been considered in some detail, the other segregation variables such as powder shape, size, porosity, and surface roughness are also important.

A second important problem with common joining processes is the lack of control, or even understanding, of dynamic mismatches of temperatures, stresses, and strain profiles in the joint region, and their variations with time. Another aspect of this invention is therefore to describe such dynamic mismatch phenomena, and to specially tailor-grade the composition and/or physical property profiles of the joint region so that the maximum or critical transient mismatch stresses never exceed the local material strength at any point inside the joint region, at any time during the heating or cooling of such joints in processing or service.

A third problem results from our incomplete understanding of the required microstructural, chemical, and physical properties of the interfacial regions in the ceramic-metal joints.

Accordingly, an object of this invention is to provide improved ceramic-metal joints and joining methods;

A further object of this invention is to provide improved ceramic metallizing methods for these joints;

A broad object of this invention is to minimize gravitational segregations of the components in the metallizing methods during or prior to the joining;

Another broad object of the invention is to specially tailor-grade, both in and normal to the joining plane, the composition and/or property profiles in the joint regions to ensure that the maximum dynamic or transient stresses do not exceed the local material strengths at any point and time;

A further object of the invention is to provide a specially microengineered interfacial region of the optimum characteristics to achieve defect-free, tough, and very strong joints;

Another object of the invention is to flawlessly coat metals or ceramics with protective materials;

A yet another object of the invention is to provide substantially flawlessly coated reinforcements for the manufacture of tough, strong, thermochemically stable, and thermomechanically shock-resistant composites;

Further objects and advantages of my invention will appears as the specification proceeds.

SUMMARY OF THE INVENTION

To these ends, the present invention method for making a structural joint between a metal and a ceramic for practical uses above 600° C. comprises uniformly metallizing the ceramic; and increasing the ratio of the ceramic material strength to the dynamic and static mismatch stresses due to differential thermal expansions so that these mismatch stresses do not exceed the ceramic material strength at any point and time thereby preventing bond failures.

DESCRIPTION OF THE DRAWINGS

The invention and its further objects and features will be more clearly understood from the following detailed description taken in conjunction with the drawings in which.

DESCRIPTION OF THE PREFERRED EMBODIMENTS

Figure 1:
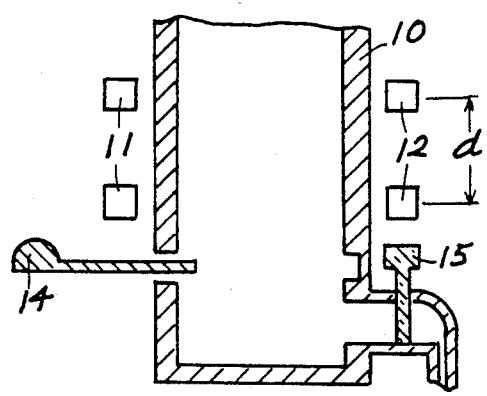
FIG. 1 shows a system for real-time monitoring of mixed settling powders.

It will be understood that the specific embodiments described herein are merely illustrative of the general principles of the invention and that various modifications are feasible without departing from the spirit and scope of the invention. That is, the invention is of general applicability for improving the quality of the ceramic-metal joints or joining methods, or coatings of ceramics on ceramics, or on metals. It is also evident that materials, structures, and methods other than those especially described can be used to practice the invention.

Stokes in 1851 first considered the resistance R which a fluid medium of density $d_m$ and viscosity n offers to the movement of a spherical particle of velocity v, diameter D and density $d_p$ suspended in it, and arrived at the equation $R=3\pi Dvn$.

The small sphere settling in the fluid (i.e., gaseous or liquid) suspension medium is acted on by the force of gravity with gravitational constant g, $\pi D^3 d_p g/6$ acting downward; and by the buoyant force of the fluid, $\pi D^3 d_m g/6$, given by Archimedes, principle and acting upward. The resultant net gravitational force G is $\pi D^3 (d_p - d_m) g/6$ acting downward, producing a downward acceleration, a.

When the resistance R exactly equals this net gravitational force G, the acceleration reduces to zero; the final velocity, $v_f$, becomes constant. There then results:

$$3\pi D\, n\, v_f = \pi D^3 (d_p - d_m)\, g/6$$

Hence, the final velocity is: $v_f = (d_p - d_m)\, g\, D^2/18\, n$, the equation of Stokes'law which has been shown to be widely valid.

For a given fluid density ($d_m$) at a specific temperature (viscosity n) and a given sphere (of density $d_p$ and mass M), the Stokes' equation gives a velocity constant:

$$v_c = v_f/D^2 = (d_p - d_m)\, g/18\, n$$

Also, the velocity at any time starting from rest, t, is:

$$v = (1 - \exp(-R\, t\, /M)) \times v_f$$

And the settling distance at time t is:

$$s_t = (t - (1 - \exp(-Rt/M)) \times M/R) \times G/R$$

The velocity equation shows that the exact $v_f$ is not reached until after infinitely long time when the exponential term in the equation turns to zero and then the velocity reduces to $v=v_f$, as it should.

With the Stokes' law, one can calculate the velocity constants, $v_c$ in 1/cm-sec; and $v_s$, for the settling in water at 20° C. ($d_m=1.0$ and $n=0.010$) of various metal or oxide powders, with densities in g/cc in parentheses, as follows: W (19.35) 100,000, $Y_2O_3$ (5.01) 21,900, Fe (7.87) 37,400, Mo (10.2) 50,100, Mn (7.2) 33,800, $WO_3$ (7.16) 33,600, $Fe_2O_3$ (5.24) 23,100, $MoO_3$ (4.692) 20,100, and $MnO_2$ (5.026) 21,900.

Thus, in the $W$-$Y_2O_3$ metallizing process, because the W powders are 3.9 (19.35/5.01) times heavier than $Y_2O_3$, the velocity constants $v_c$'s of the two components differ by a factor of $100,000/21,900=4.6$ times. That is, for a given powder size D, the final constant settling velocity $v_f$ of W spheres is 4.6 times greater than that of $Y_2O_3$ spheres. As discussed above, this wide difference in velocities results in severe gravitational segregation and early depletion of W particles in the settling mixtures and, therefore, poor metallizing results.

It can also be seen that the powders in the mixed oxide processes, e.g., $WO_3$-$Fe_2O_3$, are much more uniform in densities, $d_p$, than mixed particles of the same metals, e.g., W-Fe. Thus, the $WO_3$-$Fe_2O_3$ process shows density and velocity constant ratios of 1.366 and 1.455, vs 2.459 and 2.674, respectively, for the W-Fe process.

Similarly, in the Mo-Mn process, replacing the metal powders by their respective oxides reduces the differences in the ratios of velocity constants, $v_c$, and final velocities, $v_f$, from 48.2% to only 9.0% and 19.2% to 4.2%, respectively. In addition, the metal particles, i.e., W, Fe, Mo, and Mn when reduced during metallizing from their respective oxides are smaller than the initial oxide powders. These smaller sizes further promote homogenizations and metallizing results.

If we select and mix the $WO_3$ and $Fe_2O_3$ spherical powders in the size (diameter D) ratio of the square root of $(33,600/23,100=1.455)$, i.e., 1.206, the final settling velocities of both these size-ratioed powders will be exactly the same. That is, by simply making the $Fe_2O_3$ powders 20.6% larger than the $WO_3$ powders, the mixed particles will finally settle in water at 20 C at exactly the same velocity. This condition leads to metallizing uniformity due to the uniform composition of the finally deposited layers.

The final settling velocities of the two mixed powders, $v_s$'s, however, come only after some settling time, $t_s$, when a specific amount, Q, of the mixed powders has already settled out at differing velocities. From this settling time, $t_s$, for the specific combination of component powders, the settled amount Q and material use efficiency can be computed from the materials remaining after the settling time, $t_s$. The materials already settled before $t_s$ is the presettled distances, $s_t$, multiplied by the initial material densities. But the already settled materials are not lost, since they can be recirculated and reused in subsequent metallizing runs.

In this way, gravitational segregations between, for example, cosettling W and Fe, Mo and Mn, $WO_3$ and $Fe_2O_3$, or $MoO_3$ and $MnO_2$ powders, are minimized. Naturally, the smaller the percentage of velocity or useful powder size differences, $\Delta v$ and $\Delta d$, respectively, the lower the material use efficiency on a particular mixed-powder combination. An engineering compromise must, therefore, be struck.

The fluid suspension medium may be either a gaseous or liquid medium. The liquid may be water, alcohol, other inorganic or organic liquids of fairly constant viscosity at room temperature. A varying viscosity liquid may also be used, for example, a polymerizing organic substance containing a polymer and a hardener, a nitrocellulose in an evaporating solvent such as butyl carbitol acetate, or Duco cement diluted with rapidly evaporating acetone, to achieve rapidly increasing viscosity, n. The velocity constant of the settling powders is, as shown above, inversely proportional to this viscosity. In all cases, the starting time for achieving nearly equal settling velocities is shortened by the increasing viscosity due to polymerization or solvent evaporation. With increasing viscosities, the absolute difference in centimeters per second between the settling velocities of the two mixed powders of differing densities then become less, and nearly equal-settling conditions of powders are more easily achieved. The real-time monitoring system to be described in FIG. 1 is also useful, but the nearly equally settling mixed powders must be quickly used before much further polymerization or evaporation takes place.

Apparently the above technique for minimizing gravitational segregation through minimized settling differences can be used to handle more than two types of powders of differing densities.

In practice, we specify that the two settling velocities of the mixed particles are within a certain prespecified percentage, e.g., 20 or 10%, of each other. Still, gravitational segregations are minimized.

By repeated experimentations and computer iterations or simulations, the best mixed-powder metallizing process for optimal combined metallizing uniformity and material use efficiency can be systematically determined. Based on these principles, method and equipment can be developed for controlling the turn-on time for starting to deposit the mixed powder at nearly equal final settling velocity, $v_f$, into metallizing layers with the size-ratioed powders.

In FIG. 1, a system for real-time monitoring of the cosettling particles employed to determine the starting time for collecting the residual or still unsettled mixed particles to be used for metallization. This system has a vertical settling cylinder 10. Near the bottom of the cylinder 10, two pairs of light emitters 11 and detectors 12 are located at two different heights with emitters on one side and detectors on the opposite side of a vertical cylinder 10, to sense the settling particles. The times for the particles to pass the top or bottom emitter/detector pair determine the particle size or type being monitored, while the times for the particles to transverse through the vertical distance d between the heights give their velocities. When the settling velocities of the two types (and sizes) of the powders are within a specified percentages, a slide shuttle 14 is moved to catch on the shuttle the residual or unsettled mixed powder of nearly equal settling velocities. These equal-settling mixed powders in suspension are separated for immediate metallizing use while the already settled powders are drained through the valve 15 for subsequent reuse.

It can be seen that the above method of minimizing gravitational segregation is useful not only in ceramic metallizing, but also in painting, depositing, injecting, mixed food preparation, or plasma spraying, with multiple nonreacting solid or liquid materials of differing densities and suspended in a gas or liquid.

Useful metallizing compositions include the commonly used W:Fe or Mo:Mn system containing 10 to 30 weight percent of Fe or Mn, or their derivatives $WO_3$:$Fe_2O_3$, $MoO_3$:$MnO_2$, or other non-oxide systems. From the atomic or molecular weights of the elements W, Mo, Fe, Mn, O, Cl, F, I, Br, ... or radicals $NO_3$, $SO_4$, ..., the weight percentage of the heavy metal W or Mo and the other braze and melting temperature-lowering metals such as Cu, Zn, Pb, Sn, Bi, Fe, Mn, Ag, Au, In, ... used for the paste, suspension, or solution metallizing compositions can be readily determined. Generally, I maintain the same ratio of 10 to 40 weight percent of braze metal to the 90 to 60 percent of heavy metal in these compositions.

There are other ways to insure a substantially constant chemical composition consisting of at least two types of metallizing materials having different densities and carried in a fluid suspension medium. One way is to cause the two types of materials to come out of the suspension medium in a substantially-constant chemical composition thereby ensuring uniformity and reproducibility of the metallizing results. For example, the two types of materials may be integrated into physically integral and inseparable forms, such as by alloying the materials into integrated alloy form, or coating the internal and/or exterior surface of one type of material particles with the other material to form integrated coated powders.

Thus, tungsten particles may be alloyed or coated with iron to form integral or inseparable W-Fe powders. Similarly molybdenum powders may be alloyed or coated with manganese to form integral Mo-Mn powders that will not segregate.

Another method to minimize segregation of a single fluxing (e.g., MgO, $Y_2O_3$) or brazing (e.g., Cu, CuO, Zn, ZnO), cometallizing (e.g., Mn or $MnO_2$ with Mo or Fe or $Fe_2O_3$ with W) material is the use of an aqueous or other solution of W and/or Mo compounds such as sodium molybdate or tungstate which is soluble in water, or $MoO_3$ or $WO_3$ which is soluble in hot water particularly in the presence of $NH_4OH$. Here, the solution is the settling medium itself and suspended powders being of a single type, cannot segregate. Solutions of compounds of Cu, Zn, Fe, Mo, ... used with powders of W, Mo, $WO_3$, or $MoO_3$ achieve the same results.

To completely eliminate gravitational segregations, solution metallizing is the ideal process. Many molybdenum and tungsten compounds are soluble in water, alcohol, acid, or bases. $MoO_3$, for example, is soluble in hot or ammoniated water. Oxide, chloride, nitrate, sulfate, halogen, and other compounds of iron, manganese, nickel, antimony, lead, tin, copper, zinc, and bismuth are similarly soluble. Mixtures of W/Mo and the other solutions may be compounded into proper compositions for the metallization of various ceramics. The use of solutions of compounds, e.g., halides, of nickel, lead, tin, zinc, and copper allow these metal compounds to be reduced in a hydrogen or nitrogen/hydrogen atmosphere to supply the braze metal. In a single processing step, then, complete metallizing, brazing, and bonding is possible.

One difficulty of metallizing MACOR, Corning Glass's machinable glass ceramic, by the solution method is the relatively low, allowable metallizing temperature of about 950° C. The solubilities of the metallizing compounds are also restricting factors. Still, many potential metallizing compounds are soluble or at least partly soluble. Zinc chloride and sodium molybdate, for example, are soluble up to 432 and 65 grams, respectively, per 100 cc of cold water. Such a composite solution may be filtered to remove solid particles and used for metallizing various ceramics.

Useful W/Mo-based metallizing compounds include: X (X=W or Mo), $XO_3$, $Na_2XO_4$, $K_2XO_4$, $Li_2XO_4$, and XH (H=$F_2$, $Br_2$, $Cl_2$, and $I_2$). Useful braze metal compounds include: many $YNO_3$, YH (Y=Cu, Ag, Au, Zn, In, Fe, Ni, Mn, Ga, Sn, Pb, Cd, Tl, ..., and H=F, Br, Cl, and I). Many of these compounds are soluble in water, alcohol, or other organic or inorganic solvents and can, therefore, be used to prepare metallizing solutions. Knowing the elemental atomic weights, one can readily compute the weight of metallizing W or Mo or braze metal in each gram of these chemical compounds.

Another important consideration in making dissimilar materials joints relates to thermal mismatch stresses and strains. In any ceramic-metal joints, or for that matter, any joining of two dissimilar materials or even within a single-phase homogeneous material, the matching or mismatch of their thermomechanical characteristics in general, and thermal expansion coefficients in particular, is extremely important. From this mismatch of their thermal expansions, thermal stresses are generated.

Mismatches in other thermomechanical characteristics also result in other thermomechanical mismatch stresses and strains. The magnitude of these mismatch stresses and strains determines the failure probability of the joint.

Thermal expansion mismatch differentials of within 100 ppm (parts per million) are considered as allowable, according to Hagy and Ritland's paper on "Viscosity Flow in Glass-to-Metal Seals," J. Amer. Ceram. Soc., Vol. 40, pp. 58–62, 1957. Such thermal expansion coefficients and differentials relate only to the static or thermal equilibrium case, and may not truly represent dynamic or transient conditions when the joint is being heated up or cooled down. Yet such transient conditions always exist during the services of the joint.

Unlike the commonly used static thermal expansion mismatch, the dynamic mismatch in thermal expansion coefficients is not constant but varies with the bonded materials shapes and sizes, physical and surface properties, and heating or cooling conditions and times.

As will shortly be shown, the dynamic expansion strain mismatch may exceed the yield point of the ceramic materials, while the dynamic mismatch stress often exceeds the flexure or even comprehensive strengths of these same materials. What fails most ceramic-metal joints, or cause most coatings to crack, peel, flake, or spall, is thus the dynamic, rather than the static, thermal expansion mismatch.

Using this dynamic mismatch technique, we have been able to determine the location, magnitude, and occurrence time of the maximum or critical mismatch stresses, and take measures to reduce the dynamic mismatch stresses on the relatively weak ceramic so that the ceramic is no longer failing from the high stresses.

Dynamic mismatches result partly from the fact that metals and ceramics have widely different thermal conductivities. The conductivities for metals range from 0.014 cal/sq. cm/cm/degree C/sec for tellurium, to 1.0 for silver (same unit), while those for ceramics are from 0.0018 for glass to 1.8 for beryllia.

During heating of a ceramic-metal joint, the ceramic temperature lags behind that of the metal, often markedly so; while under cooling the opposite is true. This produces different temperature profiles in the metal and ceramic at a particular time instant on either heating or cooling. Dynamic mismatches in temperatures, strains (i.e., expansions on heating or shrinkages on cooling), and stresses (strains multiplied by Young's moduli) then result.

Take the special example of the case of a long ceramic rod joined end-to-end to a similarly sized metal rod. The ceramic may be, for example, Corning Glass's machinable glass ceramic (MACOR), while the metal may be SAE 1010 carbon steel. The joint is brazed at 950° C. and is, for the worst-case condition, suddenly air quenched in a room-temperature (20° C.) ambient.

The Fourier equation for independent radial heat conduction in long ceramic and metal cylinders is well known. The solution of the cylindrical heat conduction problem consists of an infinite series, each term of which is a product of a Bessel's function and an exponential function, as given in various textbooks on heat conduction. Data tables and master charts for cylindrical heat diffusion have been compiled. See, e.g., 1961 Gebhart's "Heat Transfer," McGraw-Hill, New York). With these equations, data tables, and master charts, one can determine the temperature profiles at different locations (i.e., radial positions, r, in a cylindrical end-to-end joint) at various time instants. From these profiles the critical temperature profile with the associated, maximum transient mismatch stresses and strains can be calculated.

The cooling down of a MACOR-metal joint from the brazing to room temperatures represents one of the most severe thermal changes, because of the wide temperature range involved. The step-by-step temperature changes, i.e., $u_m$ and $u_s$ for the temperatures of MACOR and steel, respectively, at cooling time t in seconds, at the center, (r=0) of the interfacial regions of a two-inch diameter, rod-type MACOR-steel joint are given in Table 1. Other tables have also been prepared for rods of different diameters.

The data used in the computations for Table 1 are: rod diameter D=2 in=5.08 cm, surface heat transfer coefficient=0.1 per inch for both steel and MACOR, thermal diffusivities=0.108 cm2/sec for steel and 0.0054 for MACOR, initial temperature of both MACOR and steel=950° C., and final room temperature=20° C.

Tho computed data in Table 1 show, for the particular case treated, the temperature differentials between MACOR and steel at the axial center point, (or r=0), i.e., $\Delta u = u_m - u_s$, at different cooling times t in seconds. Immediately upon cooling after brazing (t=0), this differential is zero because both the MACOR and steel are at the same brazing temperature of 950° C. Subsequently, faster cooling of the steel rod relative to MACOR causes this differential to increase with time t, until both rods are significantly cooled when the temperature differential decreases. After 29,900 seconds (8.3 hours), for example, both rods are within a few degrees of the room temperature at 20° C. The maximum temperature differential reaches 775° C. at about 1,000° C. seconds after the air cooling, giving rise to the maximum or critical dynamic mismatch stress and strain. Table 1 also shows that the temperature differential $T = u_m - u_s$ reaches 113, 144, 217, 282, 478, and 703° C. at 47.8, 59.8, 89.6, 119, 239, and 358 seconds, respectively, after the same cooling from 950° C.

By comparison, the maximum temperature differential of 727° C. at the axial center point of a one-inch (or r=1.27 cm) diameter MACOR-steel joint is reached sooner, at about 440 seconds after cooling.

TABLE 1

Nonsteady Heat Transfer Computations For a 2-inch MACOR-Steel Joint Cooling from 950 C. to 20 C.

| t | $u_m$ | $u_s$ | $u_m - u_s$ |
|---|---|---|---|
| 0.0 | 950 | 950 | 0 |
| 6.0 | 950 | 947 | 3 |
| 12.0 | 949 | 935 | 14 |
| 23.9 | 949 | 901 | 48 |
| 35.8 | 949 | 867 | 82 |
| 47.8 | 948 | 835 | 113 |
| 59.8 | 948 | 804 | 144 |
| 89.6 | 948 | 731 | 217 |
| 119 | 947 | 665 | 282 |
| 239 | 935 | 456 | 478 |
| 358 | 918 | 316 | 703 |
| 478 | 901 | 220 | 681 |
| 598 | 884 | 155 | 729 |
| 717 | 868 | 112 | 756 |
| 836 | 851 | 82 | 769 |
| 956 | 835 | 62 | 773 |
| 1200 | 804 | 39 | 765 |
| 1792 | 731 | 23 | 708 |
| 2390 | 665 | 22 | 643 |
| 3580 | 551 | 22 | 528 |
| 4780 | 456 | 21 | 436 |
| 5980 | 379 | 21 | 358 |
| 7170 | 316 | 21 | 296 |
| 9560 | 220 | 21 | 199 |
| 12000 | 155 | 21 | 134 |
| 14300 | 112 | 21 | 91 |
| 19100 | 62 | 20 | 42 |
| 23900 | 39 | 20 | 19 |
| 29900 | 27 | 20 | 7 |
| 35800 | 23 | 20 | 3 |
| 41800 | 21 | 20 | 1 |

The linear thermal expansion coefficients, f, are defined as the thermal expansion per unit length per unit degree Centigrade As given in the literature, they refer only to the static case. These coefficients are constants, at least for the respective temperature ranges. Within these ranges, they are, therefore, independent of the specimen temperature, cooling or heating rates. In addition, these coefficients do not depend on the specimen geometries, sizes, diffusivities, surface characteristics, heating or cooling conditions, and initial and final temperatures. Each material thus has a singular, unique static expansion coefficient, at least for a given temperature range.

The static thermal shrinkage (or negative expansion) strain, e, for a given material is, by definition, the static thermal expansion coefficient, f, multiplied by the temperature range of cooling, $\Delta u$, i.e., $e = f \times \Delta u$. Thus, for the steel rod, this strain is: $e_s = f_s \times \Delta u_s$, and for the MACOR rod, it is: $e_m = f_m \times \Delta u_m$.

Under equilibrium conditions, the materials of the joint, i.e., MACOR and steel, are supposed to be always at the same temperature. That is, $u_m = u_s$. Both materials are thus at the same brazing temperature of $u_0$ at the beginning of cooling (t=0). Also, at any time t during the cooling, the cooling temperature range for MACOR and steel are always the same in the static case. Thus:

$$\Delta u_m = u_0 - u_m = u_0 - u_s = \Delta u_s = \Delta u,$$

and the static expansion mismatch strain between steel and AM..MACOR is:

$$\Delta e = e_s - e_m = (f_s - f_m) \times 66 \ u = \text{constant} \times \Delta u.$$

On the other hand, dynamic thermal expansion coefficients, f*, and the resultant dynamic mismatch strains, e*, and stresses, s*, strongly depend on the joint materials, geometries, sizes, physical and surface properties, and heating or cooling conditions.

Starting with zero strain on cooling from the brazing temperature of 950° C., the dynamic strain in the steel rod is: $e^*_s = f_s \times \Delta u_s$ where $\Delta u_s = 950 - u_s$, while that in the MACOR rod is:

$$e^*_m = f_m \times \Delta u_m \text{ where } \Delta u_m = 950 - u_m.$$

The difference in dynamic mismatch strain, i.e., $$\Delta e^* = f_s \times \Delta u_s - f_m \times \Delta u_m.$$

The dynamic mismatch strain reaches a maximum of about 0.0123 at $t = 1,000$ seconds. Such high strains exceed even the yield point of steel joined to the rigid MACOR ceramic.

The dynamic thermal expansion coefficient mismatch, $\Delta f^*$, can be computed by dividing the dynamic mismatch strain, $e^*_s - e^*_m$, by the average cooling temperature range, $\Delta u_v = 950 - (u_s + u_m)/2$. This dynamic coefficient mismatch, for the 2-inch MACOR-steel rod joint cooling from 950° C. to 20° C. still depends greatly on the cooling time t. It reaches a maximum rate of about 29.6 ppm/degree C at a cooling time of bout 90 seconds, but continuously drops down to less than 5.6 ppm/degree C at $t = 1,000$ seconds, as can be computed from the data in Table 1. The total dynamic coefficient mismatch over the temperature range of 930° C. far exceeds the maximum of 100 ppm considered allowable by Hagy and Ritland.

It can also be shown that the dynamic expansion coefficient mismatch, $\Delta f^* = (f^*_s - f^*_m)_{av}$, for the 2-inch MACOR-steel rod joint cooling from 950° C. to 20° C., is two to five times greater than the corresponding mismatches for the static or equilibrium case, for cooling time t of 10 to 10,000 seconds.

Statically, MACOR only marginally "matches" with a few low-expansion metals such as Sylvania #4, Dumet, 50% nickel alloys, chrome-iron stainless, platinum, Sealmet, and titanium, according to Corning Glass. Because of this two to five times greater dynamic expansion coefficient mismatch relative to the static coefficient mismatch, we must conclude that, dynamically, MACOR and steel joints now become totally "mismatched", at least in so far as the specimen configuration, size, and brazing conditions given above are concerned.

To approximately compute the dynamic mismatch stresses, one may further neglect the presence of the braze and the metallized layers, and use a Timoshenko approach as follows. Consider a portion of the steel specimen of unit length and unit cross-sectional area, brazed together with a MACOR specimen of equal length and cross-sectional area. At time t after cooling from the brazing temperature of 950° C., the temperature of the steel is $u_s$ and $\Delta u_s = 950 - u_s$, while the temperature of MACOR is $u_m$ and $\Delta u_m = 950 - u_m$. The steel specimen has thus shrunk from unit length to $1 - f_s \times \Delta u_s$, while the MACOR has shrunk to $1 - f_m \times \Delta u_m$. The steel has shrunk more than MACOR, since both $f_s$ and $\Delta u_s$ are greater than $f_m$ and $\Delta u_m$. To maintain joint integrity at the ends, the originally stress-free but overshrunk steel must be stretched with dynamic tensile stress $s_s^*$ by the adjoining MACOR, to length y from length $1 - f_s \times u_s$, while the undershrunk MACOR must be compressed with dynamic compressive stress $s_m^*$ by the steel, to the same length y from length of $1 - f_m \times \Delta u_m$.

Hence, the tensile stress in the steel, $s_s^*$, is $$s_s^* = E_s \times (y - 1 + f_s \times \Delta u_s)/(1 - f_s \times \Delta u_s)$$

where $e_s$ is the Young's modulus of steel, i.e., 30,000,000 psi; while the compressive stress in MACOR, $s_m^*$, is $$s_m^* = E_m(1 f_m \times \Delta u_m - y)/(1 - f_m \times \Delta u_m)$$

where $E_m$ is the Young's modulus of MACOR, i.e., 5,000,000 psi.

Apparently, $s_s^* = s_m^*$. Hence, $$y = ((1 - f_m^* \times \Delta u_m)E_m + (1 - f_s^* \times \Delta u_s))/(E_s + E_m)$$

From these equations, we compute the equal dynamic mismatch stresses in MACOR and steel, $s_m^* = s_m^*$, to reach over 52,800 psi, well above MACOR's flexual strength of 15,000 psi or even its comprehensive strength of 50,000 psi.

Similarly, dynamic or transient differences in temperatures, thermal expansion coefficients, thermal expansion strains, and thermal mismatch stresses have also been computed for differently sized cylindrical MACOR-steel joints, at various radial locations and cooling time instants. The dynamic mismatch stresses and strains are all unexpectedly high.

Thus, dynamic mismatch stresses, not static ones, usually fracture the brazed metal-ceramic joint.

Measures must therefore be taken to reduce the dynamic mismatch stresses on the relatively weak ceramic so that the ceramic is no longer subjected to the high stresses. This reduction can be achieved by, e.g., absorbing a major portion of the dynamic mismatch stresses normally present in the ceramic through the use of a soft, yieldable metallic braze. These measures prevent the brazed joint failures particularly from these dynamic mismatch stresses, because residual or actual mismatch stress between the two joined materials is the theoretical mismatch stress with a portion thereof absorbed in the metallized or brazed layer.

Figure 6:
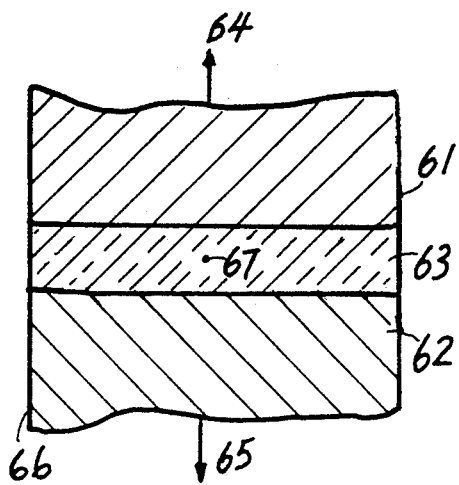
FIG. 6 shows a cooling method after metal-ceramic bonding to achieve controlled solidification and elemental segregation for overcoming dynamic mismatch stresses.
Figure 7:
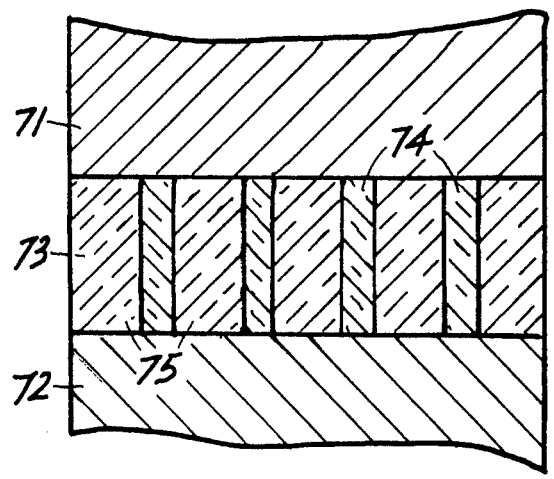
FIG. 7 shows another new method of overcoming mismatch stresses.
Figure 8:
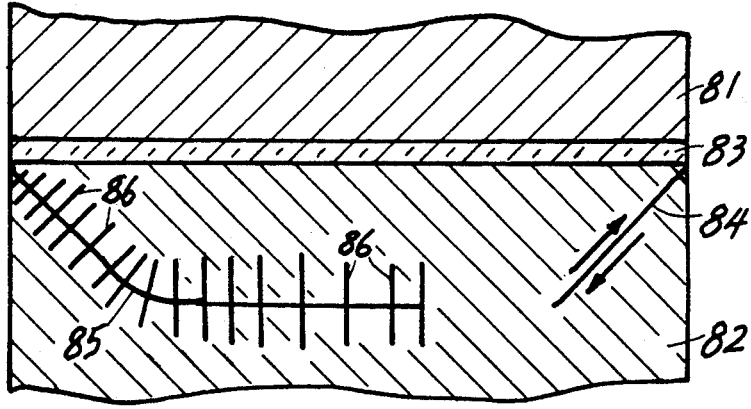
FIG. 8 shows another composite method involving reinforcing fibers strategically positioned and oriented to overcome interfacial surface failures in the ceramic.

Specifically, this invention also describes the following methods, for uses singly or in combination, to minimize or neutralize these high mismatch stresses and strains 1) Using a soft, yieldable metal layer to braze the metallized ceramic to the metal, and to absorb within the braze layer a large or major portion of these mismatch stresses so that the relatively weak MACOR or other ceramic is no longer subjected to high stresses thereby preventing fractures;

2) Radially grading, or controllably and gradually changing in (i.e., parallel rather than perpendicular to) the joining plane or bonding interfacial region, the thermal conductivity (or reciprocal of thermal resistivity), thermal expansion coefficient, and tensile strength of the braze metal, to ensure that the maximum residual mismatch stress, after absorption in the braze or the shock-absorbing interfacial region to be described below, will not exceed the local material strength in the ceramic at any point and time;

3) Controlled cooling of the liquid braze layer to achieve radially outward solidification and elemental segregation for the desired patterns of radially graded properties (FIG. 6);

4) Using as the braze layer a plurality of strength columns of small lateral dimension (and therefore minimal expansion differential) embedded in a matrix of soft metal (FIG. 7);

5) Using elongated reinforcing fibers or sheets placed along the potential fracture path and variably oriented to best resist tensile fracturing stresses (FIG. 8);

6) Combining the conventional axial grading to change the thermal expansion coefficient of the braze layer from the ceramic side toward the metal side, to minimize direct mechanical interaction between the steel and ceramic members;

7) A toughened and strengthened microengineered interfacial region between the ceramic and metallized layer to absorb thermomechanical shocks; and 8) A new method to achieve flawless bonding regions.

The first two objectives are achieved by providing a novel composite metallic braze layer or disc 10 consisting of a central copper core 11 inside an outer copper alloy ring or washer 12 made of, e.g., 70:30 Cartridge brass. This composite metallic disc joins together a ceramic body 14 and a metal body 15, as shown in FIGS. 1a and 1b. This disc, lying parallel to and forming part of the bonding interfacial region, has. The linear thermal expansion coefficient of pure copper is 16.5 ppm/degree C, while that of, for example, 70 Cu:30 Zn Cartridge brass is 19.9 ppm/degree C. Also, the tensile strength of the brazing-annealed, soft pure copper is only 15,000 psi, while that of the 70:30 Cartridge brass is over 40,000 psi, or about three times greater.

Hence, the tensile strength and thermal expansion coefficient of the peripheral region in my composite braze disc is 2.67 times and 1.21 times, respectively, of those of the central pure copper core. The thermal conductivity of pure copper at 0° C. is 0.920, while those of 11% and 32% Zn:Cu are 0.275 and 0.260, respectively. Hence, the thermal conductivity of 30% Zn:Cu Cartridge brass is about 0.261. That is, the thermal conductivity of the peripheral cartridge brass in our composite braze disc is only 0.261/0.920=28.4%, or much less than 50% or 70% of, that of the central pure copper core.

These combinations of linear thermal expansion and tensile properties achieve the required results. In a ceramic-steel joint, the maximum or critical transient mismatch temperatures, dynamic expansion mismatch, and thermal strains and stresses occur in the axial centers of the interfacial regions. I therefore have dead soft, brazing-annealed, pure copper at the core regions. This copper, with a yield strength less the fracture strength of the ceramic, is highly and easily yieldable to absorb much or most of the dynamic mismatch thermal strains and, therefore, stresses. Pure copper also has relatively low thermal expansion to reduce these mismatch effects in the first place. In addition, the pure copper is a good thermal conductor, equalizing the temperature between the centers, as well as their outer and regions, of the steel-MACOR joint, and thus further minimizes mismatch strains and stresses On the other hand, the outer peripheral regions of the braze disc is made of relatively highly expansive but the low thermal-conducting brass. At these peripheral regions, the mismatch temperature differentials are relatively small. The higher tensile strength is even desirable at the large-area peripheral regions to enhance the joint strength.

This composite braze disc design will thus provide the required radially tailor-graded profiles of braze composition, thermal expansion coefficient, braze strength, and thermal conductivity needed to overcome or minimize the critical dynamic mismatch stresses.

The composite braze discs can be made by, for example, metallurgically cladding or mechanical press-forming a sphere or disc inside a washer, at least two concentric tubes, or other combinations of different materials.

Elemental interdiffusion during the braze manufacture, brazing operation, or special pre- or post-brazing heat-treatment can modify or provide any reasonable composition profiling in the braze discs for achieving the desired tailor-grading results.

Skilled persons can, of course, select other yieldable metals such as gold, silver, tin, lead, indium, zinc, or even iron or nickel, or other materials to replace copper, and select other chemical elements to replace the copper-strengthening zinc. The resultant new alloys will, of course, be different in compositions, strengths, diffusivities, thermal conductivities, melting or softening points, and other properties.

Thus, Cu-Ag, Cu-Al, Cu-As, Cu-Bi, Cu-Ca, Cu-Cd, Cu-Fe, Cu-Li, Cu-Mg, Cu-Mn, Cu-Ni, Cu-P, Cu-Pd, Cu-Pt, Cu-S, Cu-Sb, Cu-Si, Cu-Sn, Cu-Te, Cu-Ti, Cu-Zr can be similarly used to minimize dyanmic mismatch stresses. Alloys of Ag, Al, Au, Bi, Cd, Co, Cr, Ge, Fe, Ir, Li, Mg, Mn, Mo, Ni, Pb, Pd, Pt, Rh, S, Sb, Si, Sn, Ta, Te, Ti, V, W, Zn, Zr, than Cu, are also useful.

By properly controlling the cooling of a metal-ceramic joint, the desired lateral grading effect can also be achieved. For example, as shown in FIG. 6, after the joining of a metal cylinder or plate 61 to a ceramic cylinder or plate 62 of about the same diameter, the cylindrical surfaces are cooled slowly relatively to the free or unjoined ends. Heat is mainly extracted axially at these ends 64 and 65, and not radially at the cylindrical surface 66. The center 67 of the bonding regions is of the resultant joints are thus cooled fast and solidified first. The solidification propagates radially outward. According to the Ag-Cu phase diagram, in a Ag-Cu alloy braze disc, the first-freezing center portion then has relatively pure Ag or Cu metal, if the original alloy composition contains less or more, respectively, than 28 weight percent of Cu. According to the theory of alloy solidification, subsequently solidifying cylindrical layers in the resultant braze disc will be less and less pure in Ag or Cu. The last solidifying cylindrical surface layer will be the Ag-Cu eutectic containing 28% (by weight) of Cu and 72% of Ag. Thus, the physical properties are laterally graded, by solidification, in the solidified braze disc. The central relatively pure metal portion of the bonding region will be softer and more thermally conductive than the peripheral eutectic region. By selecting a suitable initial braze composition, the center can even also have a smaller thermal expansion coefficient than the peripheral eutectic.

This controlled cooling method is particularly effective with large, flat joints when the ratio of diameter or lateral size is large relative to the length or thickness.

FIG. 7 shows a joint between a metal 71 and a ceramic 72 whose braze layer 73 consists of a plurality of load-carrying strong columns 74 (e.g., 70:30 Cartridge brass) embedded in a relatively soft matrix 75 of pure copper. Since the individual strong columns 74 have minimal lateral dimensions (a few millimeters or less), the thermal mismatch expansion strains and stresses are small.

FIG. 8 shows the usual failure patterns in a metal (81)-ceramic (82) joint, or coating of ceramic on metal, due to mismatches that result in debonding, cracking, blistering, peeling, and spalling. The crack initiates at the peripheral surface between the metal (including braze 83) and ceramic and is inclined at 45° to the horizontal. The mismatch stresses are tensile in the metal 81 but compressive in the ceramic 82. The compressive stress induces a shear which is maximum at the 45° plane 84 (see the right side of the figure). The crack or fracture initiates at 45° but levels to horizontal. By placing elongated reinforcing members 86 such as strengthening carbon fibers or weaved sheets 86 in $Al_2O_3$ ceramic 82 along the fracture path in varying directions (i.e., locally normally of the tensile stresses) to best take up the tensile mismatch stresses along the fracture path 85, the failure may be prevented. Note that in the left side of FIG. 8, the directions of the elongated reinforcing fibers change from 45° at the metal-ceramic interface to nearly vertical deep inside the ceramic 82.

Another method to overcome dynamic stresses is to grade the composition, and therefore usually thermal expansion coefficient and other physical properties in such a way that the local composition gradient is roughly proportional to the local temperature gradient. There are four cases to be considered for this functional grading:

1. Maximum critical dynamic stresses occur when the ambient-exposed surface is rapidly heated with a constant ambient temperature heating, such as inserting a ceramic-metal bond into a constant-temperature hot or furnace environment;

2. Maximum critical dynamic stresses occur when the outer surface is rapidly heated with a fixed quantity of heat, such as during high-intensity, constant-power pulsed laser or electron beam pulse or pulses;

3. Maximum critical dynamic stresses occur when the outer surface is rapidly cooled with a constant ambient temperature bath, such as when the ceramic-metal joint is rapidly quenched in, e.g., air or water of constant temperature;

4. Maximum critical dynamic stresses occur when the surface is rapidly cooled by taking away a fixed quantity of heat, such as dropping a fixed quantity of water for rapid evaporation and heat absorption per unit area of the outer surface.

It is well-known in thermal or the equivalent material diffusion art that cases 1 and 3 are "infinite source" diffusions and give error function complement (erfc) solutions, while cases 2 and 4 are "constant-source" diffusions and give exponential function for their solutions. T overcome dynamic mismatch stresses due to transient thermal heating, I functionally grade the material compositions such that the major alloying element or elements favorably affect the thermal expansion coefficient or the local material strength These elements are selected to decrease the thermal expansion coefficient or increase the strength in proportion to their content and the surface composition is also either error-function complementarily graded or exponentially graded in the proper direction, respectively for cases 1 and 3, or 2 and 4. For cases 1 and 2 where heat is applied, I shall add the major element or elements to in-diffuse, while for cases 3 and 4, I shall subtract the major elements (i.e., getter material) to out-diffuse material. For infinite material sources, I use constant-concentration ambient such as unlimited supply of gaseous, liquid, or solid diffusing material. For constant material sources, I use limited or fixed quantity of diffusing material For in-diffusion, I use diffuant materials, while for outdiffusion, I use gettering material to getter or remove from the surface the major elements.

After the material surface diffusion or outdiffusion treatment, with a constant or infinite source, the resultant surface composition profile or critical physical property profile will be exactly shaped (i.e., exponentially or erfc graded), and even possibly similar to, the anticipated maximum critical transient temperature profile. This condition insures that the local maximum stress never exceeds the local material strength at any time, and thus best withstands the transient thermal stresses due to this type of transient heating or cooling.

The above two and other methods of overcoming dynamic mismatch stresses are not only useful for dissimilar material joints, but for even a single-phase homogeneous material subjected to critical thermal surface profiles, such as when a carbon-carbon composite is subjected to high-intensity laser pulses.

If all these measures are still insufficient to prevent dynamic thermal mismatch failures, the conventional axial elemental grading or sudden composition changes may be added One method consists of providing a disc of low-expansive metals such as Sylvania #4, Dumet, 50% nickel alloy, chrome-iron stainless, platinum, Sealmet, and titanium placed intermediately between the steel and the copper braze. In this way, the ceramic MACOR is mechanically isolated from the highly expansive steel. The desired elemental profiling can also be achieved through controlled diffusion.

My lateral grading technique produces graded metal-ceramic microjoints in parallel, while the conventional axial grading technique produces graded metal-ceramic microjoints in series. The optimum combination of the two lateral and axial gradings can be analyzed by simulation techniques. Even electrical analog techniques can be used to determine the optimum combination of parallel and series microjoints by arranging electrical resistors in various parallel/series combinations, either in actual experiments or on the computer.

All the above measures increase the ratio of the ceramic material strength to the dynamic and/or static mismatch stresses due to differential thermal expansion so that these mismatch stresses do not exceed the ceramic material strength at any point and time thereby preventing bond failures.

In addition to achieve metallizing uniformity and minimal mismatch stresses, I have also found it desirable to microengieer the chemical compositions, microstructures, and mechanical properties of the bonding interfacial regions between the ceramic and metallized layer. Merely perfecting the interfaces surfaces alone, as is commonly done, is inadequate to produce strong and reliable joints for withstanding the unavoidable, severe mismatches stresses and strains as shown above.

Different physical, chemical, and electrical metallizing or film-forming methods have been developed. Each has its unique advantages. Some, for example, are atomically precise. Others thoroughly clean the substrate surfaces for better adhesion. Some others result in crystalline epitaxy, which is necessary for semiconductor or other devices. Others produce splat cooling and superfine grains, with resultant enhanced mechanical properties, for example, increased Young's modulus. Still others are done at low temperatures to avoid unwanted thermal effects. But none deal effectively with the critical problem of thermal mismatch stresses and strains.

For extremely shock-resistant joints or metallized layers, I have found it absolutely necessary to have a carefully microengineered interfacial layer between the ceramic and the metallized layer. This layer is designed to absorb the major portion of the always present mismatch stresses and strains. Many of my ceramic metallizing processes typically last more than 20 minutes and involve liquid-forming layers containing, directly or indirectly, $MoO_3$ which melts at 801° C., and $WO_3$ which melts at about 1550° C. This melting point can be further reduced by alloying with other compounds of metals such as ZnO or PbO. Liquid diffusion is rapid with diffusion coefficient $D_l = 1$ E-4 to 1 E-5 $cm^2$/sec. Processing for t=20 minutes gives a diffusion length of up to the square root of $D_l \times t = 0.35$ to 0.11 cm. In addition, a diffused interfacial layer of graded composition, microstructures, and mechanical properties is formed which can be highly shock-absorbing.

In contrast, most conventional bonding or coating processes involve only solid-state diffusion. Solid diffusion is slow with diffusion coefficient $D_s = 1$ E-10 to 1 E-20. Even for the same processing or diffusion time t, which these processes do not have, the diffusion length is only 3.2 microns to 3.2 A, or several orders of magnitude shorter than that in my liquid diffusion case. The mismatch stress gradient is thus proportionately steeper.

Liquid diffusion for 20 minutes thus produce a stabilizing effect or, in the electrical art, pre-aging or burning-in result, that would require about 19 years for solid diffusion results even at moderate high temperatures such as 500° C.

Plasma spraying does involve liquid droplets in rapid transit. These extremely high-temperature droplets impact the substrate at very high velocities resulting in splat cooling with millisecond liquid dwell times. The resultant diffusion length is thus also over three orders of magnitude shorter than my fusion metallizing or metallizing-brazing case. Splat cooling gives very fine grains with high Elastic moduli which actually increase the mismatch stresses. Also, the superheated liquid particles form refractory oxides, nitrides, or other surface layers during transit preventing perfect bonding between the particles themselves. Laser, electron, and some other energetic beam enhanced coating processes also give splat cooling and solid-diffusion conditions.

Without applying any external pressure to force the joining members together, I have used metallizing and bonding processes described above to join various ceramics to metals with pure copper brazes. A typical metallizing process comprises using a mixture of metallizing composition such as $WO_3$-$Fe_2O_3$ or $MoO_2$-$MnO_2$ in suspension or paste form and applied onto the ceramic, heating for 5 to 25 minutes the coated ceramic to about 800°-1500° C., with no need for the pressure application. The ratio of heavy metal W or Mo to Fe or Mn after reduction from the compounds is between 9:1 to 6:4. This metallizing may be followed by or simultaneously done with brazing with, e.g., copper or its alloys. Hydrogen or forming gases of 10 to 50 volume % of hydrogen is the desirable metallizing atmospheres.

Different compositions other than the usual W-Fe or Mo-Mn may also be used. For example, metal powders or oxides, carbonates, nitrates, chlorides, fluorides, iodides, bromides, or other compounds of W, Mo, Cu, Ni, Bi, Sn, Pb, Sb, . . . may be employed, generally in amounts from 10 to 90 percent by weight of the equivalent refractory W or Mo metal.

In some cases, W or Mo may not be necessary. In joining carbon (graphite, diamond) to iron alloys (steels, stainless steels, alloy steels), a single-step eutectic metallizing/brazing method may be used. This involves contacting carbon directly onto the steel, and heating the assembly to a temperature of from 1080°-1350° C. Pure iron and carbon form a eutectic at 1154° C. at 4.3% by weight. of carbon. But common steels contain other elements such as Mn, Si, S, P, Al, Cr, Ni, . . . . All these elements lower the eutectic temperature and shift the eutectic carbon composition. Hence, useful bonding with common carbon steels occur at about 1050° C. However, the higher the bonding tempearture, the better the bond strength and thermal shock resistance. The controlled cooling method of FIG. 6 may be used here to advantage.

The graphite, carbon, or diamond surface may be first coated with a layer of the W/Mo-based material prior to the single-step metallizing/bonding process. The bonded carbon-steel joint may be water quenched while hot or molten to achieve strength and hardness in the steel.

Using the same C-Fe eutectic brazing principle, other carbon-metal bonding methods are possible, according to T. B. Massalski's Binary Alloy Phase Diagrams, ASM, 1986: Au:3/1050 (namely, Au with 3 weight percent of carbon forms eutectic at 1050° C.), B:1.5/2075, Co:2.68/1321, Cr:3.2/1400, Hf:0.2/2250, Ir:1.6/2296, La:2.2/806, Li:2/165, Mn:1.3/1215, Mo:3/2205, Nb:7.5/2339, Ni:0.6/1326, Os:1.32/2732, Pd:2.8/1504, Pt:1.2/1705, Re:1.3/2486, Rh:2.1/1694, Ru:1.8/1924, Si:0.5/1404, Ta:2/2825, Th:0.5/1720, Ti:0.5/1648, U:0.1/1119, V:4/1650, W:1.9/2715, and Zr:0.4/1823.

The metallizing temperatures and times depend on other factors, such as unwanted reactions. For example, in graphite-aluminum composites, the treatment temperature should not exceed about 750° C., to prevent carbide formations. A carburizing atmosphere, such as one containing $CH_4$ or propane, may be useful to prevent too much loss of carbon in the joining of carbon, diamond, or carbon-carbon composite.

The ceramics I have already bonded with my W/Mo-based metallizing methods described here include: diamond, alumina, zirconia, silicon carbide, beryllia, yttria, graphite, quartz, silicon, mullite, cordierite, Corning's MACOR and Vision glass, piezoelectric ceramics, graphite-aluminum composites, carbon-carbon composites, and 123 high-temperature superconductors. Useful structural metals for the joints include copper, nickel, stainless steel, high-nickel or cobalt iron alloys, or even low-cost highly "mismatched" ordinary cold-rolled SAE 1010 carbon steel. Even with the "mismatch" between ceramic and carbon steel, structural joints brazed with pure copper can be repeatedly thermal cycled without fractures between 980° C. (i.e., about 100° C. below the melting point of copper braze) and ice water followed by mechanical shocks including 8 to 10-foot drop tests onto carpeted, wood, or even marble floors. Poco graphite AXF-5Q to SAE 1010 carbon steel rods, ¼" in diameters and joined end-to-end, also are resistant to rapid quench from 800° C. to 0° C. in ice water and severe mechanical shocks. Carbon-carbon composite with carbon steel joints have been similarly made.

These results show that: 1) with my improved processes, low-cost "mismatched" ceramic/metal, carbon-metal, ceramic-ceramic, or ceramic-graphite joints, i.e., the ceramic and metal members are mismatched, or have substantially different coefficients of thermal expansion can be made; 2) these joints can be mechanically strong and thermally shock resistant; 3) the bonding processes, being ceramic material-limited, need no further improvement for the particular material combinations and thermal shock requirements; and 4) these joints are, after bonding and thermomechanical shocks, free of pores, microcracks, inclusions, inhomogeneities, i.e., single metallurigical phase), and other defects at which fractures originate. Each of these shocks would multiply the number of defects exponentially and have failed the joints. These joints, including particularly the metallized layers, thus compare favorably with, e.g., certain ceramic-metal joints or ceramic materials developed at great cost, as reported in the literature.

Surface plating or coating my metal-ceramic joints in various forms with ceramics (including diamond, SiC, A1203, ZrO2) or precious and refractory metals (Pt, Pd, Ir, Hf, Au, Cr, . . . ) makes the joints resistant to corrosion, erosion, oxidation, or surface reactions. Metal-plated or coated ceramic-coated metals, metal-coated ceramics, structural metal-ceramic joints, are biocompatible as implanted bones, teeth, or organs.

Note that our new joints may use only thin layers, not bulks, of tungsten/molybdenum; and generally contain no other strategic and expensive metals such as nickel, cobalt, or chromium. The metallized layer adherently joins to the ceramic. Upon this metallized layer, tenacious, protective metal or ceramic layers can be brazed or formed which resist spalling, peeling, and thermomechanical shocks. Improved corrosion, wear, or frictional properties on these coatings are also possible by suitable selection of the coating materials.

A solid lubricant system may be made, e.g., comprising graphite, talc, or $MoS_2$ powders chemically bonded in copper, bronze, nickel, steel, or cast iron. Also, carbon-carbon composites with improved strength and oxidation resistance are possible. Advanced chemically bonded intermetallic compounds and materials (titanium or hafnium carbide, and titanium or nickel aluminides) are also made available. The same W/Mo-based metallizing compositions are even useful as almost universal high-temperature adhesives or sealants for ceramics or metals.

It is even possible to leave only the metallizing molybdenu and/or tungsten between the materials to be joined without any other braze metal layer, the operating temperature of the joint is then generally limited by the melting point of the metallized layer.

The flawless and defect-free quality of my ceramic-metal joints or metallized layers on ceramics or graphite are particularly important for tough, fatigue-resistant, protective, easily wettable, and thermochemically stable coatings on ceramics, metals, or graphite, or metal-ceramic joints. A metallized or coated graphite fiber, for example, cannot tolerate a single pinhole or microcrack that allows oxygen to penetrate and to destroy the fiber. Ceramic coatings on metals also cannot have defects when exposed to chemically reactive, high-intensity ion or plasma, high temperature, or other extreme enviroments. High-melting precious melts such as Pt, Os, and Pd and oxidation resistant metals such as Cr Al and Ni are therefore beneficially applied onto the metallized layer, or be formed simultaneously with a metallizing-brazing composition in a single-step metallizing-coating process. Less protective metals such as gold, copper, magnesium, titanium, or zirconium may also be applied onto, formed simultaneously with, the metallizing layer, followed by coating by electrolytic, electroless, or spraying methods, of the above-mentioned oxidation resistant metals for oxidation protection.

In addition, the metallized or metallized/brazed layers have good wetting characteristics. Further, the metallizing or metallized/brazed layer penetrates and seals all surface pinholes, microcracks, or other defects in the ceramic at the interfacial bonding region. These defects are thus converted from crack-initiating points, surfaces, or regions actually to strengtheners. A thick (over 100 microns thick) metal layer of controlled residual stress applying compression to the ceramic further toughness the brittle ceramic. Graphite or carbon fibers or particles may thus not only be oxidation resistant but surface toughened and non-brittle.

My invention also leads to a new generation of "high-fidelity" machining tools. I'd use diamond, alumina, zirconia, boron carbide, or other ceramics, to be defect-freely and tenaciously joined to metals including inexpensive carbon, stainless, or other alloy steels. In present clamped-on or screwed-on ceramic tool bits, the fragile ceramic is highly prestressed even when the tool is not in use. In my new tools the ceramic tool bit is not prestressed locally and will not work loose under any conditions. In contrast to other bonded ceramic tools, the bonding regions in my new tools are defect-free and actually strengthen the diamond or ceramic. Hence, even under extreme vibrations, heavy loads, or thermomechanical shocks, the machining forces and motion are transmitted directly and with high fidelity to the tool tips. Greater machining accuracy, less tool chatter, wear and breakage, and longer tool life and reliability are possible.

Our metal-diamond bonds also have important electronic applications. Of all potential semiconductor materials, diamond has the highest radiation resistance, thermal conductivity, breakdown voltage, saturated electron current, but the lowest dielectric constant. These things combined lead to the best high power, high frequency, high temperature, and radiation-hard devices. Diamond circuits could operate at up to 600° C. or 475° C. higher than Si or GaAs, respectively, eliminating cooling equipment now occupying, e.g., 65% of the average satellite.

Natural or synthetic diamond is also rigid, noncontaminating, and chemically stable, readily cut to precise sizes, and easily cleaved and polished to microinch finishes. Excelling also in electrically insulating and thermally conducting properties, it thus is a potential substrate for high-power, laser, microwave, and fast-switching VLSI circuits.

Diamond is transparent to laser. The metallizing/brazing of diamond to metal can be done with pulses of high-intensity $CO_2$ or other laser. The laser beams are transmitted through the diamond without causing much heating, but heat up the metal (steel, Ni, Si, GaAs, . . . ) to form joints of precise sizes at exact locations. The bonding can even be done at below the melting point of a low-melting substrate because of the localized short laser pulses.

Coated with my metallized/brazed films up to 20 microns thick, ceramics, boron, graphite, diamond, or glass powders 0.5 through 50 to 200 microns in diameters, are also suited for specific particulate reinforced composites. Upon compacting and sintering these metal coated particles to proper densities and mechanical properties, special acoustic or otherwise damping materials are obtained.

With my methods, sapphire, quartz, alumina, or zirconia tubes can be sealed vacuum-tightly to niobium, tantaium, or other ceramic tubes to make useful electronic cavity or optical windows for services to or over 1300° C. or 1500° C. Ny bonding method will also avoid the usual frits seals which are weak, contaminating, short-lived, deteriorating to electrooptical characteristics of the component, and otherwise unreliable in operations.

Defect-free or flawless coatings or bondings are also necessary to contain dangerous materials and should be used to replace weldments which almost always have bubbles, oxides inclusions, segregation patterns, severe residual stresses, weak grain boundaries, or other defects.

The strong, defect-free, and thermomechanically shock-resistant quality of the metallized layers on ceramics, graphite, diamond, and reactive metals such as titanium, zirconium, aluminum, or stainless steel is especially important in the manufacture of advanced composites Here, the reinforcing fibers, particulates, sheets, or two- or three-dimensional weaves of the ceramics, graphite, boron, oxides of aluminum or zirconium; and carbides or nitrides of Ti, Zr, Hf, V, Nb, Ta, Cr, Mo, or W; borides of carbon or nitrogen; silicides, aluminides, other intermetallics; diamond; and metals are then perfectly not only wetted by, but bonded to, the matrix of metals, ceramics, carbon, borides, nitrides, carbides, diamond, . . . Good interfacial bond strengths in, e.g., about 20 volume % graphite, SiC, or $Si_3N_4$ fibers or particles in Type 6061 aluminum, alumina, or zirconia, allow efficient load transfer between the matrix and reinforcing particulates, fibers, or weaves thereby giving maximum specific moduli and strengths. These defect-free bondings at the interfaces prevent debondings and allow ideal load transfer between, within, and along the reinforcing members thereby achieving maximum strength, production yield, and productivity at minimum costs.

Useful relatively low-melting soft, yieldable braze metals include pure copper (with melting point 1083° C.), silver (961.9° C.), gold (1064.4° C.), tin (232.0° C.), zinc (419.6° C.), lead (327.5° C.), antimony (630.5° C.), cadmium (320.9° C.), aluminum (660.4° C.), magnesium (648.8° C), gallium (29.8° C.), indium (156.4° C.), thallium (303.5° C.), bismuth (271.3° C.), . . . . Higher-melting metals such as beryllium, chromium, cobalt, hafnium, iridium; iron, manganese, nickel, niobium, osmium; palladium, platinum, protoactinium, rhenium, rhodium; ruthenium, samarium, scandium, silicon, tantalum; thorium, titanium, uranium, vanadium, yttrium, and zirconium allow the practical operating temperatures of the joints to be raised to near their respective melting points of 1278, 1857, 1495, 2227, 2410; 1535, 1244, 1455, 2468, 2700; 1554, 1772, 3000, 3180, 1966; 2310, 1300, 1541, 1430, 2996; 1800, 1660, 1130, 1890, 1522, and 1852 degrees Centigrade, respectively.

When molybdenum is used as the metallized layer together with an osmium, rhenium, platinum, protoactinium, rhenium, and tantalum braze layer, the melting point of molybdenum, i.e., 2810° C., rather than that of the braze layer, generally limits the useful temperature of the joint. Similarly, when tungsten (melting point 3410° C.) and carbon (melting point 3650° C.) are used as the metallized and brazed layers for more refractory materials, respectively, the lower tungsten melting point dominates. A variety of new, metallized fibers or particulates of, e.g., SiC, $Si_3N_4$, $Al_2O_3$, $ZrO_2$, mulllite, cordierite, diamond, glass, quartz, and other ceramics can thus be produced that can be used as reinforcement in composites for temperatures over 1500, 2000, 2500, 3000 degrees Cnetigrade, or higher.

Chemical reactions between the matrix and reinforcement are serious problems in composites. In graphite-aluminum composites, for example, the graphite reinforcement may react with matrix aluminum to form brittle aluminum carbide. At a given service, processing, or other operating temperature over about 800° C., the graphite-aluminum interfacial reactions may thus be intolerable. High-melting metals given above and used as the metallized/brazed layers on the graphite slow down the elemental diffusion rates and, therefore, graphite particulate- or fiber-matrix interfacial reactions. The heavy metals W or Mo and refractory metals slow down even further. This is because the elemental diffusion rates are functions of the ratio of the operating temperature to the absolute melting temperature At the same operating temperature of, e.g., 550° C., this ratio for aluminum directly contacting graphite is $(550+273.1)/(660.4+273.1)=0.882$. With nickel braze on the graphite fibers according to my invention, the interfacial reaction is now between nickel and graphite, and the same ratio is reduced to $823.1/(1455+273.1)=0.476$. When the graphite fibers are metallized with Mo or W, the same ratios are further reduced to 0.267 or 0.223, respectively. With a wide variety of available metallizing alloys (e.g., W-Fe, Mo-Mn, . . . ) and coated layers on ceramic reinforcing fibers and particulates, these ratios can be selectively chosen to be less than, e.g., 0.6, 0.5, 0.4, 0.3, 0.22, or even less. The matrix-reinforcement interfacial chemical reactions are thereby reduced. Weakening of composite strength is minimized and embrittlement of reinforcement or destruction of composite avoided.

Interfacial chemical reactivity between, e.g., ceramic reinforcement and the metal matrix, can be further suppressed or totally eliminated by coating the metallized/brazed layer with chromium or aluminum. Chromium, aluminum, and their alloys form adherent, dense oxides that resist further oxygen penetration to, e.g., the underneath graphite fibers. These specially metallized/coated graphite or carbon fibers are thermochemically stable in oxygen or other oxidizing atmospheres.

Even mismatch ceramic-metal joints made according to my invention refused to fail under repeated, rapid and severe thermomechanical shocks. Further, the final forced fractures occur away from the bonding regions. This shows that the bonds are free of flaws, microcracks, inclusions, and other defects. In addition, the bond is actually stronger than the weaker ceramic member. This is because the liquid layer formed on the ceramic surface during the metallizing step, generally from 5 to 50 microns thick, actually seals surface notches and other flaws. The metallizing W/Mo ingredients, from examination of microphtos, also strengthen the ceramic at the interfacial region through solution strengthening, or formation of microcomposite reinforcement in the form of precipitated particulates and reinforcing roots, branches, or networks.

In many composites, weight is a critical consideration. Because of the heavy densities of W and Mo, a very thin W/Mo-based metallized/brazed layer, down to several atomic layers in thickness, may be used with or without any copper, nickel, or other braze metal. The formation of a surface liquid diffusion layer 3 to 30 atomic layers (about 10 to 100 A) takes only $10E-9$ to $10E-7$ seconds, if a liquid diffusion coefficient of $10E-5$ cm $\times$ cm/sec is used. The control of such extremely thin layer can still be achieved by applying a thin layer of the metallizing solution containing the limited but exactly controlled amount of molybdate or tungstate compounds.

Another problem with composites is that ceramic, graphite, and carbon fibers are very difficult to be perfectly wetted by, or bonded to, metals, other ceramics, or even to epoxy. Because of this difficulty, an airplane or other vehicle made of these composites often structurally fails under cyclic environmental heat-moisture conditions. Under capillary attraction forces, rain or condensed moisture on the composite surface deeply penetrates, or is sucked in, along the tiny passageways in the unbonded or poorly bonded interfacial regions between the graphite or other ceramic fibers and the epoxy, metal, or ceramic matrices This penetration is facilitated by air release in, for example, an improperly oriented one-dimensional reinforcement where water enters from the outside skin and move freely along the entire length of the fibers, with entrapped air being forced to leave out of the inner surfaces This fills the composite structure with water. When the environment turns cold, the filled water expands on freezing, disruptively enlarging the passageways and further debonding the reinforcement from the matrices. Repeated filling-expanding cycles may destroy the composites. When a high-altitude airplane lands in a hot humid weather, moisture automatically condenses onto the very cold composite skin and similarly fill the passageways. The vehicle may take off again into the same freezing attitude where the filled water expands on freezing with disruptive forces. Multiple cycles of landing and high-altitude flying also destroy the composite.

Figure 2A:
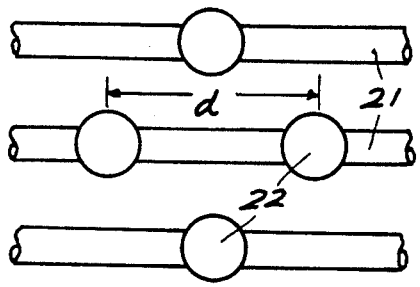
FIGS. 2a and 2b show nodular bonding spots on reinforcing carbon fibers in carbon composites.
Figure 2B:
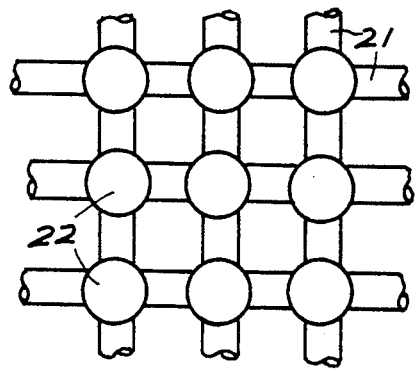

By uniformly covering these fibers with flawless metallized W/Mo-based coatings, with or without brazing materials, the bonding between these coatings and the matrix will also be flawless. Water penetration is then impossible. Periodic coating of all the strands of these fibers 21 along their lengths with nodular metallized spots 22 at a specific distance d apart breaks up the passageways into small compartments of length d (FIG. 2a). Water can now penetrate to no more than the same distance d below the composite surface. Dipping a two-dimensional or three-dimensional fiber weave into a W/Mo-based metallizing solution or paste, again with or without braze, preferentially coats only the intersections of the fibers with the metallizing compound to thereby form the required nodules for stopping deep water penetration (FIG. 2b). The size of the nodular metallized spots can be controlled by adjusting the viscosity and/or solid content of the solution or paste. Wetting control with the addition of acetone, alcohol, house detergent (e.g., Wisk) also helps.

The reinforcing graphite or other ceramic fibers selectively but perfectly bonded at the nodulated or coated spots in the composite achieve excellent load transfer between fibers, or even along the fibers in metal-matrix composites, but allow systematically and controllably unbonded or weakly bonded regions between the nodules, lending to excellent toughness as well as heat and shock resistances.

The ceramic metallizing processes described in this invention also allow the brazing or coating of the internal or external surfaces of ceramics of controlled densities or porosities. More specifically, porous alumina, zirconia, silicon carbide, yttria, mullite, and cordierite have already been metallized with my methods on either the internal pores, external surfaces, or both. Substantially 100% of the internal surfaces of the porous ceramic can be metallized by my processes. Ceramic filters for, for example, molten steel, aluminum, or other metals or materials are already in wide uses. But the difficulty of perfectly bonding these weak and porous filter ceramic medium to each other or to metals make their uses difficult, tricky, unreliable, and often dangerous. By bonding these ceramic filters to steel wires or plates, as I have done, these handling problems are minimized.

Multi-stage ceramic filters of alumina, zirconia, silicon carbide, yttria, mullite, cordierite, glass, or other ceramics strongly bonded to the same or different ceramic of the same or increasingly finer pore sizes can now be joined together, one on top of the other. Metal-reinforced multi-stage filters can also be made for, e.g., added strength through metal strengthening; multiple-purpose separations of gases, liquids, or solids from one another through physical means due to size differences; absorption by carbon; catalytic reactions by platinum; liberation or desorption of gases such as oxygen, nitrogen, carbon oxides, or hydrogen from the bonded oxides, nitrides, carbides; hydride for doping or addition to the molten metals or other materials; separation of substances of the same gas, liquid, or solid phases; and other special features functions.

Ceramic filters for air, gas, oil, transmission fluids, and cooling water on automobiles, diesels, power generating equipment, and other machineries are already available. Similar filters for various other fluids including molten metals such as steel or aluminum, or catalytic reactors can, with my bonding methods, be strongly attached to internal or external carbon steel or stainless steel containers, other metallic, carbon, or ceramic hooks, knobs, holders, fasteners, protrusions, strengtheners, friction contacts, or springy devices for easy handling or to form fluid-tight enclosures without fluid by-passings.

Catalytic materials such as platinum alloys may also be coated on the metallized layer via diffusion coating, brazing, electrolytic or electroless plating. Reactive materials such as yttria or CaO can also be made porous by sol gel, or by controlled powder packing and sintering, to achieve any desired powder sizes and packing or sintered densities. Such reactive ceramic filters, properly bonded to metal structures, may be used, for example, to remove weakening sulfur in high-quality tool steel poured through these filters.

An electric heater may surround, or be embedded in, the porous ceramic filter for periodical activation with electric ohmic heating to burn to ashes or gases the materials remaining on the ceramic filtering medium. This achieves reusable or self-cleaning results.

Many other uses in differing industries of my bonding methods are possible. These include ceramic composites, graphite composites, intermetallic composites, metal-matrix composites, coatings on ceramics, graphite, or metals, high-strength chemically bonded ceramics, and self-lubricating materials containing, e.g., lubricating talc, $MoS_2$, or graphite particles in iron, steel, copper, or nickel. The composites may involve reinforcing fibers or particulates of ceramics, intermetallics, graphite, or metals in a matrix of ceramic, intermetallic, graphite, or metal.

Using my metallizing methods described above, metallized refractory metallic compounds can be formed for uses as the matrix or reinforcement for composites. These compounds include: oxides of Al, Ba, Be, Ca, Cr, Eu, Gd, La, Mg, Ni, Pu, Ru, Sm, Sc, Si, Th, Ti, U, V, Y, and Zr; carbides of Al, B, Ba, Be, Ca, Hf, Mo, Nb, Si, Ta, Th, Ti, U, V, W, and Zr; borides of Ba, Ca, Ce, Hf, Mo, Ni, Sr, Ta, Th, Ti, U, V, and Zr; Sulfides of Ca, Gd, Sr, U, and Y; nitrides of Al, Hf, La, Nb, Nd, Sc, Si, Pr, Pu, Ta, Th, Ti, U, V, Y, and Zr; and aluminides of Fe, Ni, Pt, Be, and Ti. Particularly attractive among these compounds are: $Si_3N_4$, SiAlON, SiC, $Al_2O_3$, mullite, AlN, $B_4C$, $TiB_2$, and BN.

Light, strong, tough, and reliable structural Al, Mg, Be, Ti alloys in composite forms can thus be made with metallized graphite, SiC, or other ceramic reinforcement that will operate over 480° C.

Powders of a ceramic, carbon, intermetallics, or reactive metal may be similarly metallized to achieve flawless and perfectly wetting surface characteristics so that the sintered powder compacts or liquid metal infiltrated composites will form that have unusually high strengths, densities, and thermal conductivities. Such metallized powders can also be cast as particulate reinforcements or strengtheners. These same powders can be cast (by, e.g., hot squeeze method) to achieve near net shape or net shape into complex structures or components.

Figure 3B:
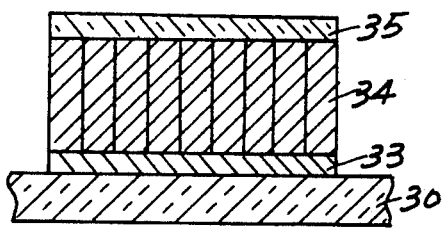
FIGS. 3a and 3b show a multi-purpose bonding method for high tempearture ceramic superconductors.
Figure 3A:
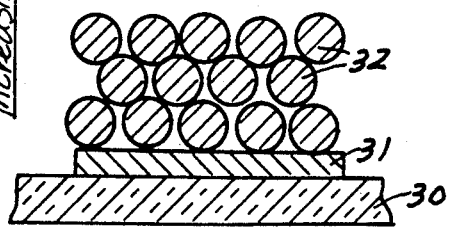

A multi-purpose procedure for bonding, sintering, purifying, densifying, strengthening, and otherwise improving the high temperature 123 ceramic superconductor is shown in FIG. 3. High temperature superconductors are superconductors which superconducts at above 90 degrees K (Kelvin). In this multi-purpose procedure, a layer of a suitable $MoO_3$-based mixture 31 is formed at selected spots on the copper substrate 30, as shown in FIG. 3a. $MoO_3$ is the key ingredient in many of my Mo-based metallizing operations. It melts at 801° C., but the melting point can be lowered or raised to selectable temperatures by forming eutectics or compounds with, e.g., CuO, BaO, and $Y_2O_3$, and other oxides such as AgO, CaO, or TlO (Thallium oxide), or even flourides, chlorides, or iodides in view of Ovshinsky's promising results on superconducting and particularly current-carrying capabilities. Upon this $MoO_3$-based layer is spread the $YBa_2Cu_3O_{7-x}$ powders 32. A vertical temperature gradient is applied to the composite so that the top of the superconductor powders is at least 20 to 50° C. below its melting point, while the bottom of the $MoO_3$-based layer is above the melting point of this mixture. This mixture layer will then melt, form the liquid-diffused bonding interfacial region 33, and sweep upward (FIG. 3a) to achieve the following highly desirable results:

1. Metallizing and bonding of the bottom layer of 123 superconductor to the copper substrate;
2. Temperature gradient zone-melting to purify the superconductor boundaries according to Pfann (See: Zone Melting, Wiley, 1966);
3. Vertically oriented, upward superconductor columnar grain growth 34;
4. Grain boundary scavenging, oxygenation, or halogen doping;
5. Liquid phase sintering of the superconductor particles for improved sintering speed, density, mechanical strength, and material stabilities partly also due to the purified or doped grain boundaries;
6. High critical current density of the purified, thinner, and oriented grain boundaries;
7. Cushioning or shock-absorbing qualities of the liquid-diffused, chemically and mechanically graded interfacial layer 33 between the superconductor film and substrate; and
8. Simple, low-cost, single-step and mass-producing but potentially high-yielding film-making operation.

After this special temperature-gradient multi-purpose operation, most of the impurities will be dissolved in the sweeping zone. This zone eventually comes up to the surface to be frozen into a highly impure layer 35. This impure layer can be removed by, e.g., grinding or chemical etching with mineral acids. See FIG. 3b.

Low current density in high $T_c$ ceramic superconductors is still a major problem, particularly in polycrystalline, bulk or thick film materials. Improper grain boundaries are mostly responsible. My special multi-purpose bonding method overcomes this problem.

Other high-temperature ceramic superconductors such as $Tl_2Ba_2Ca_2Cu_3O_{10}$ and $TlCa_2Ba_3Cu_4O_x$ can be similarly bonded or treated for properties improvement with the above method. The substrate does not have to be pure copper, but can be other metals such as aluminum, nickel, or iron, glasses, graphite, or diamond. In addition, other ceramics such as $Al2O3$, $ZrO_2$, SiC, carbon, glasses, diamond, or even metals powders or filaments, be similarly bonded onto metallic, ceramic, glass, or carbon substrates. The ceramic layer 34 with thinned, purified, oriented grain boundaries have improved physicochemical properties including thermal and electrical conductivities since grain boundaries are well-known to contribute to resistivity.

In ceramic-metal joints other than for superconductor application, however, the above zone-melting procedure is harmful from the bond strength viewpoint. This is because the last-solidifying layer, usually of complex ceramic eutectic compounds, is weak and brittle and reduces the joint strength. The proper cooling direction after the metallizing here should, therefore, not be vertical but horizontal. In this way, the last-forming layer is laterally swept out of the joint region without harmfully affecting the joint strength.

According to the above disclosures, I microengineer the ceramic-metal, ceramic-metallizing layer, and/or metallizing-braze layers by substantial thickness and, more important, graded composition, thermoconductivity, and mechanical properties. The W/Mo-based metallized layer may be, for example, 10 to 20 or 30 microns containing a graded interfacial layer up to 5 or 10 microns. The effective liquid diffusion length described above may range from 5 to the entire 30 microns. These layers are obtained by liquid diffusion, generally through melting for over five minutes but up to one hour. The Cu, Ni, or alloy braze layers may also be chemically, mechanical, and physically graded, as described above.

Figure 4A:
FIGS. 4a through 4d show newly microengineered microstructures of the bonding interfacial regions.
Figure 4B:
Figure 4C:
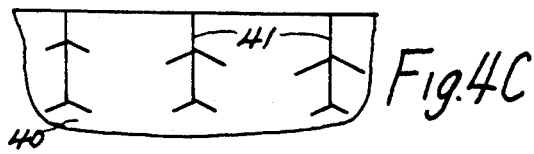
Figure 4D:
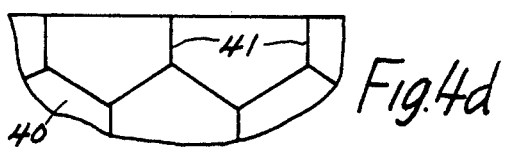

Another important grading of the interfacial layer relates to the microstructure. Many conventional joints rely on superficial adhesion, weak and defective chemical bonding, or mechanical anchoring with roughened surfaces Rough surfaces increase surface area by about 41.4% with 45-degree slopes or valleys (FIG. 4a). An important feature of my invention is the principle of rooting (FIG. 4b), branching (FIG. 4c), and networking (FIG. 4d). Straight roots of the metallizing materials 41 penetrate, during the metallizing or rapid liquid diffusion period, deep along the ceramic grain boundaries 40. These roots may be in the form of fibers located at the intersections of the multiple boundaries, or in the form of sheets each located between two adjacent ceramic grains. These fibers and sheets may be straight, extending generally perpendicularly to the ceramic-metal interface (FIG. 4a). They may form branches following the grain boundaries (FIG. 4c). These roots may even grow deeply into the grain boundaries and turn or curve around to form a partial or complete network (FIG. 4d). The formation of these fibers or sheets depend on the surface energies of the metallizing compounds relative to those of the ceramic grain at the metallizing temperature. The depth of penetration also depends on these energies, but primarily on the metallizing temperature and time.

Preferably, these penetrating metallizing material form reinforcement in a matrix of the ceramic material at the interfacial region. This can be achieved by selecting a W/Mo-based metallizing composition which, with the ceramic at the metallizing temperature, forms hard (Mohr hardness over 8 or 9 versus less than 7 or 6 for the matrix), tough, and strong compounds. Useful compounds include $PbMoO_4$, $MgWO_4$, $CaMoO_4$, $MnWO_4$, $MnMoO_4$ and the like. In practice, I simply use pure starting materials such as $MoO_3$, $WO_3$, PbO, CaO, ... , prepare the exact or near stoichiometric compositions for the metallizing compositions, and metallize at a temperature 50° to 200° C. above the melting points of these compounds. By varying the metallizing time, the grain-boundary reinforcing compounds penetrate to different depths, according to the square root of time diffusion law. For example, for a liquid diffusion case with a diffusion coefficient of $10E-5$ cm×cm/sec, metallizing for 5 to 60 minutes gives a diffusion length or penetration depth of about 0.055 to 0.19 cm. I also achieved moderately different penetrations of reinforcing particles, fibers, or sheets of different penetration depths by changing the metallizing compositions, e.g., from the W-based type to the lower-melting Mo-based type.

Thus, with my new ceramic-ceramic or ceramic-metal joining methods, new structural joints, coatings, or surfaces can be produced that have wide uses due to their hardnesses (diamond, alumina, zirconia), hardness and resistances to wear (diamond, zirconia) or corrosion (diamond, carbon, alumina), electrical or thermal conductivity/insulation (zirconia, beryllia, diamond, silver, stainless steel), catalytic activity (platinum), and other properties or appearances.

Tool bits of silicon carbide or nitride, alumina, diamond, boron carbide, and other cutting or abrasive materials can, for example, be metallized with my methods and joined to steel holders to form cutting, drilling, milling, or other machining tools. Particles of the same materials, mixed with the W/Mo metallizing compounds together with copper or nickel brazing alloys, can be spread onto inexpensive carbon steel sheets 0.010 to 0.250 mils thick. Upon heating in a reducing atmosphere, a steel sanding sheet or block is formed. The braze metal may be very thin and merely joins the abrasive particles to the steel plate. The same braze metal may have a thickness up to 95% of the size of the particles, to support fully and hold strongly these particles while still allowing their sharp cutting edges to perform.

Figure 5:
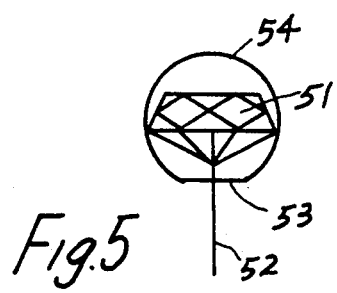
FIG. 5 shows a bonding method for mounting diamond or other gem stones.

Gem stones such as diamond, sapphire, quartz, and the like can be mounted onto metal holders. Because of the excellent strength of the bond, the gem stones need not be constantly prestressed and minimum contact with holding metals is needed. As shown in FIG. 5, diamond 51 can now be mounted on the tip of a fine wire 52 so that practically its entire back surface can be brilliantly illuminated. Also, different back characteristics (color, texture, and reflectivity) can now be instantly changed.

The invention, as described above, is not to be construed as limited to the particular forms disclosed herein, since these are to be regarded as illustrative rather than restrictive. Various combinations, equivalent substitutions, or other modifications of the preferred embodiments described herein are obviously possible in light of the description, without departing from the spirit of the invention. In particular, other ceramics such as alumina or zirconia may be used instead of MACOR with the same or a modified metallizing composition. Accordingly, the invention is to be limited only as indicated by the scope of the appended claims:

I claim:

1. A method for making a liquid-diffusion formed, fully dense and substantially defect-free ceramic-metal joint for practical uses at temperatures over about 630° C., comprising:

providing a ceramic;

providing a metal;

selecting a ceramic metallizing composition having a plurality of mixed powdered metallizing ingredients and, when molten, causing reactions between the ingredients and also with the ceramic to form a metallized layer thereon;

preparing the composition to have gravitationally substantially nonsegregating qualities when applied onto said ceramic;

coating onto a selected surface of the ceramic a layer of the metallizing composition, assembling together the metal and the coated ceramic surface;

heating the assembled metal and coated ceramic surface to a temperature at which the metallizing composition melts to cause said reactions between the ingredients and with the cermaic thereby achieving ceramic metallization at the selected surface; and keeping the composition molten for a sufficiently long time to thereby form on the ceramic by liquid diffusion the metallized layer for bonding the ceramic to the metal, said metallized layer being strong, adherent, fully dense, substantially defect-free, and thermomechanically shock resistant and having a controlled interfacial region of substantial thickness whose microstructure is substantially free of voids, inclusions, and microcracks.

2. A method as in claim 1 wherein said heating and keeping steps are done without any external pressure being applied onto the assembled ceramic and metal members.

3. A method as in claim 1 wherein said ceramic and metal are mismatched and have substantially different coefficients of thermal expansion.

4. A method as in claim 1 wherein said metallized layer is a single metallurgical phase having no inclusion, inhomogeneities or second phases.

5. A method as in claim 1 wherein the ceramic metallizing and bonding of the metallized ceramic to the metal is done substantially simultaneously in a single processing operation.

6. A method as in claim 1 for application with carbon reinforcing fibers in the manufacture of carbon composites, each fiber having a plurality of strands, and wherein said heating and keeping steps metallize each strand of every fiber and bond flawless, nodular metallized spots along the length of each fiber at a prespecified periodic distance apart.

7. A method as in claim 1 for metallizing a ceramic wherein said heating and keeping steps metallize the selected surface of the ceramic with a uniform metallized layer comprising an element selected from the group consisting of tungsten and molybdenum, said layer in its entirety having a substantially constant chemical composition; and said heating and keeping steps keep the assembled ceramic and metal heated for a sufficiently long time at a temperature at least 50 degrees Centigrade above a temperature at which the composition at least partially melts to thereby form the shock-resistant, liquid-formed bonded layer of graded composition.

8. A method as in claim 7 wherein said ceramic is a material selected from the group consisting of diamond and graphite and wherein said heating and keeping steps are done in an atmosphere selected to minimize the loss of carbon from the cermaic.

9. A method as in claim 7 for forming a metallized ceramic in the form of a graphite fiber and wherein said heating and keeping steps bond the fiber surface with a liquid-solidified, pinhole-free and microcrack-free layer of metals selected from the group consisting essentially of W, Mo, Cu, Ag, Au, Sn, Zn, Pb, Sb, Cd, Al, Mg, Ga, In, Th, Bi, Cr, Co, Fe, Mn, Ni, Nb, Pt, Pd, Pd, Rh, Ir, Os, and Ru.

10. A method as in claim 7 for use in forming a powder metallurgy product with powders selected from the group consisting of ceramics, boron, graphite, diamond, or glass in the range of 0.5 to 200 microns in diameter and wherein said heating and keeping steps bond metallized layers of up to 20 microns thick onto each powder, and including the additional step of compacting and sintering the thus surface-metallized powders to prespecified densities and mechanical properties.

11. A method as in claim 7 wherein said ceramic is a porous ceramic of controlled density or porosity, and wherein said heating and keeping steps bond the metallized layers onto the entire internal surface of all the pores in the porous ceramic.

12. A method as in claim 7 for use in a ceramic fiber-reinforced composite subjected to cyclic environmental heat-moisture conditions and wherein said heating and keeping steps bond all strands of the ceramic fibers periodically along their lengths with bonded nodular metallized spots at a specific distance apart to break up the moisture passageways into small compartments between the nodular metallized spots.

13. A method as in claim 12 wherein said ceramic fibers are in the form of multi-dimensional weave and including: providing the metallizing composition in a liquid or paste form; dipping the multi-dimensional ceramic fiber weave into the metallizing liquid or paste to preferentially provide the metallizing liquid or paste at the intersections of the fibers to thereby form the bonded nodular metallized spots for stopping deep water penetration; and controlling the size of the nodular metallized spots by adjusting at least one parameters of the metallizing liquid or paste composition selected from the group consisting of viscosity, solid content, and wettability of the composition.

14. A method as in claim 1 wherein said selecting step selects a ceramic metallizing composition of two metallizing ingredients; and including the additional step of providing one of the ingredients in a solution form while supplying the other ingredient in powders of a single substance suspended in said solution thereby ensuring substantially uniform and reproducible metallizing results.

15. A method as in claim 1 wherein said selecting step selects a ceramic metallizing composition of at least two metallizing ingredients; and including the additional step of integrating the at least two ingredients into a physically inseparable form so that the ingredients will provide a substantially constant chemical composition throughout the coated layer thereby ensuring substantially uniform and reproducible metallizing results.

16. A method as in claim 15 wherein said integrating step consists of alloying the at least two ingredients into a single substantially homogeneous alloy form.

17. A method as in claim 15 wherein one of said at least two ingredients is a solid powder while the other ingredient or ingredients are also solid, and said integrating step consists of coating the surface of said one ingredient powder with the other ingredient or ingredients to form physically integrated coated solid powders.

18. A method as in claim 1 wherein said selecting step comprises selecting the ceramic metallizing composition having two powdered ingredients of densities and sizes $d_1$ and $D_1$, and $d_2$ and $D_2$, respectively, $d_1$ and $D_2$ being respectively greater than $d_2$ and $D_1$, both powders being suspended in a common suspension medium of density $d_m$, and including the additional step of selecting the ratio of the powder sizes $D_1/D_2$ to be at least equal to the square root of $(d_1-d_m)/(d_2-d_m)$ so that the final settling velocities of the two powders in said medium are nearly the same thereby improving the uniformity and reproducibility of the metallizing results.

19. A method as in claim 1 wherein said selecting step comprises selecting the ceramic metallizing composition having a plurality of powdered ingredients of densities and sizes $d_1$ and $D_1$, $d_2$ and $D_2$, ..., $d_i$ and $D_i$, ..., respectively, all powders being suspended in a common suspension medium of density $d_m$, and including the additional step of selecting the powder sizes $D_1$, $D_2$, ..., $D_i$, to make the $D_i^2/(d_i-d_m)$ substantially constant so that the final settling velocities of all the powders in said medium are nearly the same thereby ensuring substantially uniform and reproducible metallizing results.

20. A method as in claim 1 wherein said ceramic is to be bonded onto a holder, and wherein said coating step coats only a selected single point on the ceramic while the heating and keeping steps metallize the ceramic at the single coated point for bonding thereat to the holder sufficiently strongly and defect-freely for normal handling thereby leaving substantially the entire back surface of the ceramic unbonded and fully exposed to the ambient.

21. A method as in claim 20 wherein said ceramic is a gem stone selected from the group consisting of diamond, sapphire, and quartz.

* * * * *